United States Patent [19]
Mulder et al.

[11] Patent Number: 4,875,191
[45] Date of Patent: Oct. 17, 1989

[54] INTEGRATED READ AND PROGRAMMING ROW DRIVER

[75] Inventors: Theodor Mulder, Milpitas; Ronald W. Swartz, Granite Bay, both of Calif.

[73] Assignee: Intel Corporation, Santa Clara, Calif.

[21] Appl. No.: 222,408

[22] Filed: Jul. 21, 1988

[51] Int. Cl.[4] .............................................. G11C 13/00
[52] U.S. Cl. ............................... 365/189.01; 307/530; 365/189.05; 365/230.01
[58] Field of Search ................... 365/189, 230, 189.01, 365/189.02, 189.04, 189.05, 230.06, 230.01; 307/530

[56] References Cited
U.S. PATENT DOCUMENTS

4,807,193 2/1989 Takemae et al. ................ 365/189.01

Primary Examiner—Terrell W. Fears
Attorney, Agent, or Firm—Blakely, Sokoloff, Taylor & Zafman

[57] ABSTRACT

The present invention is an EPLD device having an integrated read and programming row driver using CMOS technology. A shared node is coupled to activate output inverters which drive row word lines. During the read mode, another CMOS inverter, which is coupled to a read input line, controls the signal on the node for driving the output inverters. During the programming mode a plurality of programming transistors which are coupled in series to the shared node is activated by address signals to pull the shared node to a lower potential. The integrated read and programming row driver circuit combination reduces the physical size of the associated circuity used in the pitched constrained area.

12 Claims, 3 Drawing Sheets

FIG_1 (PRIOR ART)
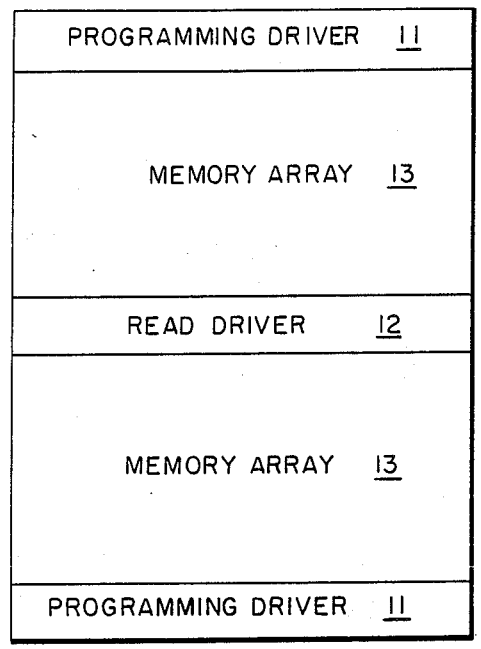
FIG_2 (PRIOR ART)
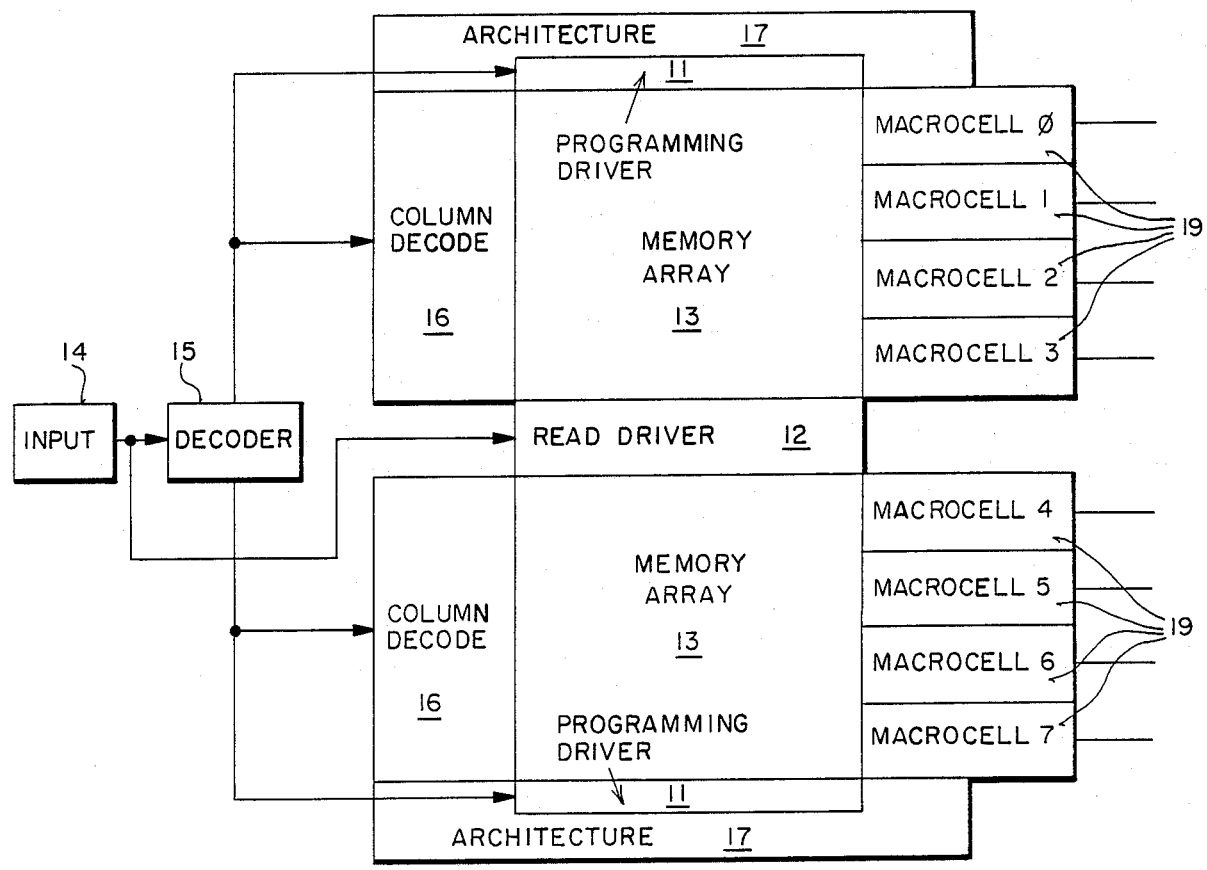

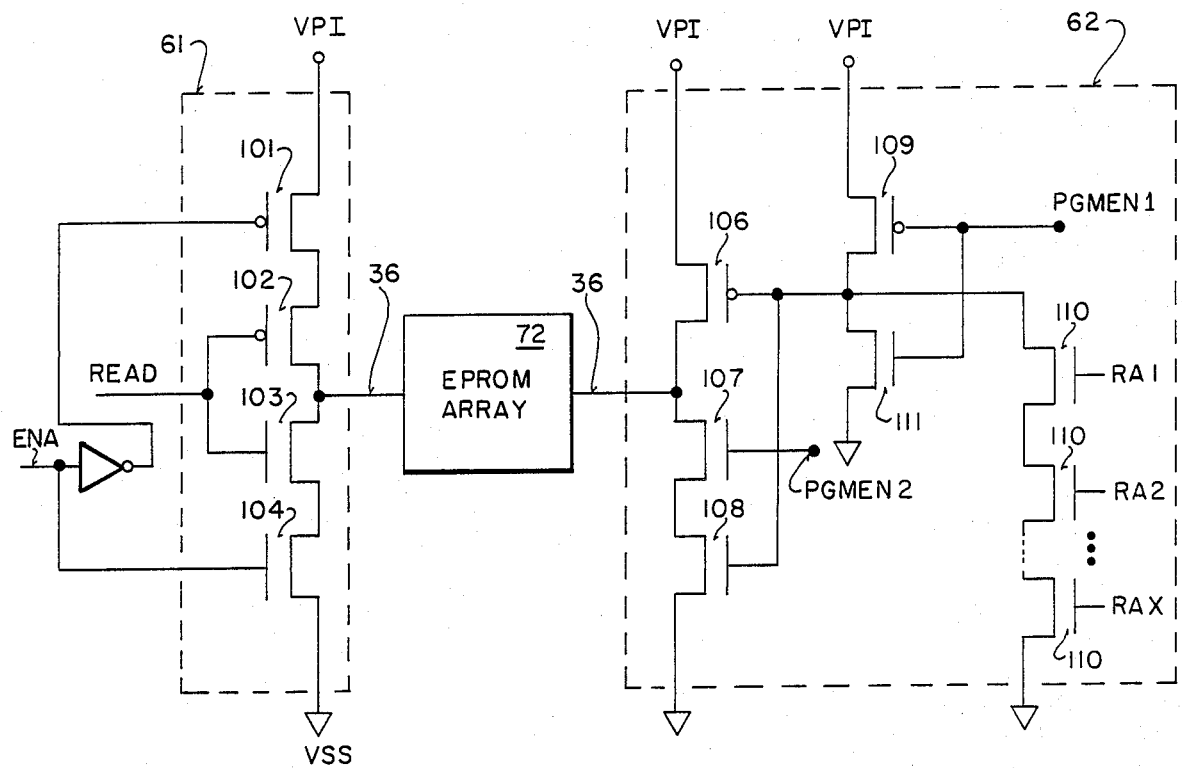
FIG_3 (PRIOR ART)
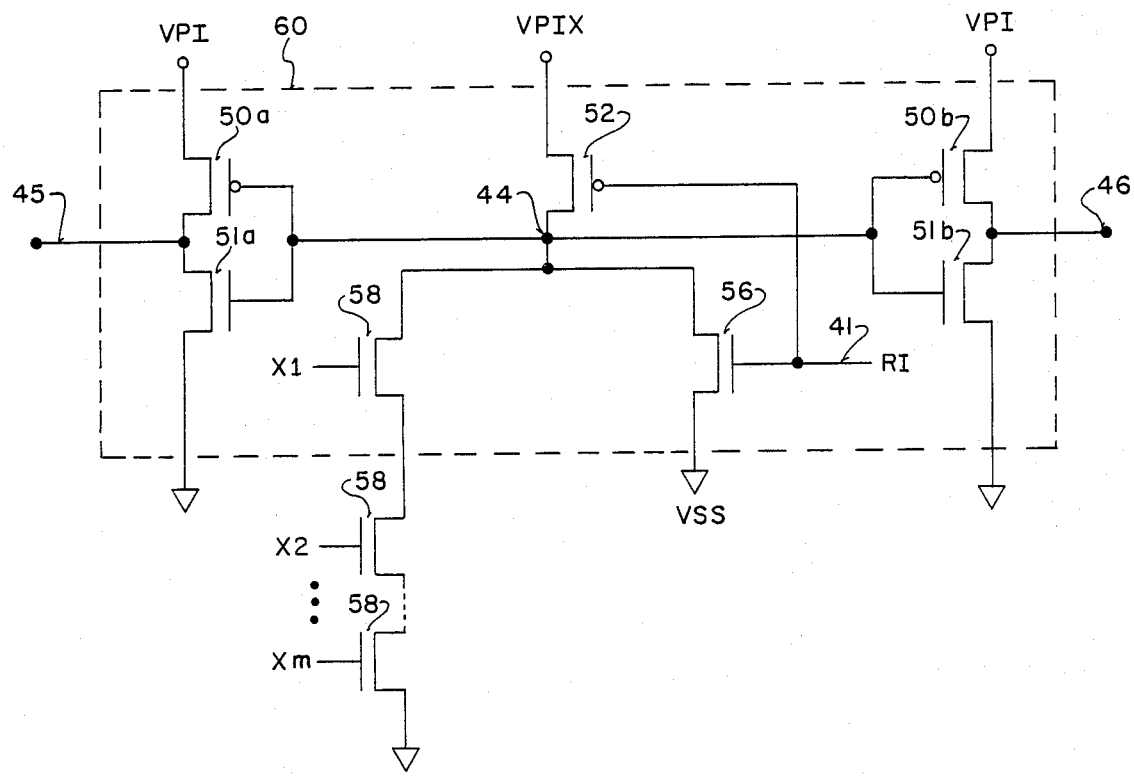
FIG_6

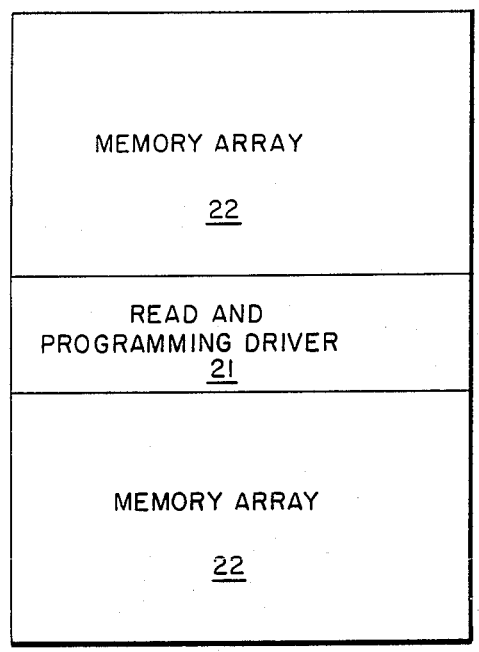
FIG_4
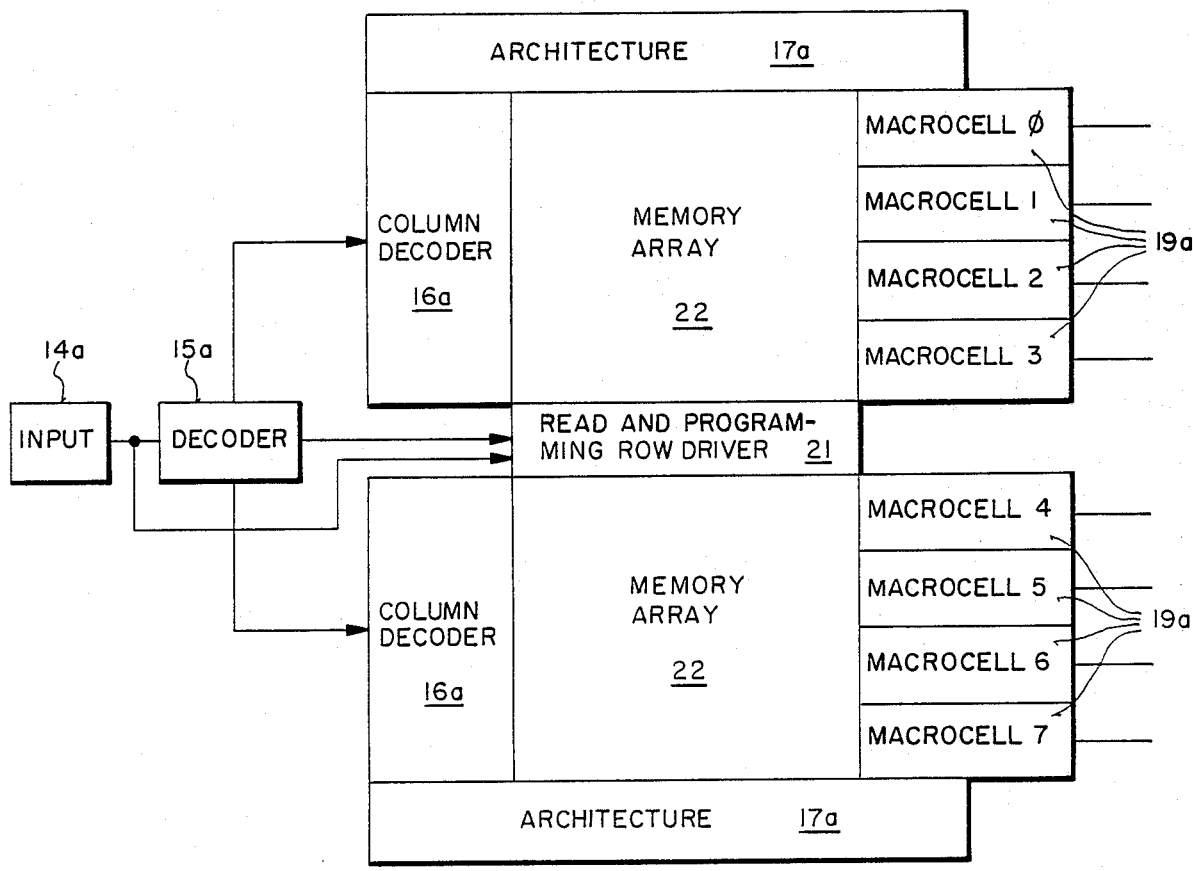
FIG_5

INTEGRATED READ AND PROGRAMMING ROW DRIVER

BACKGROUND OF THE INVENTION

1. Field of the Invention.

The present invention relates generally to erasable programmable logic array devices and, more particularly, to an integrated read and programming row driver for such a device. The present invention is an improvement upon current erasable programmable logic device (EPLD) technology.

2. Prior Art

Prior art programmable logic array devices using electrically programmable read only memories (EPROMs) are described in U.S. Pat. No. 4,609,986 and U.S. Pat. No. 4,617,479. Typically in these prior art EPROM devices, there is a pitch constrained area in which certain circuitry must be located for optimum device operation. A pitch constrained area is a limiteed section of the device occupied by the memory cells and associated circuitry which requires its physical placement to be proximate to the memory cells. Typically, the pitch constrained area is comprised of the memory cells and critical circuitry which must operate adjacent and not physically distant from the memory cells. Typically, read/programming circuitry, architecture circuits, and macrocells to process outputs from the array must reside within this pitch constrained area. The adjacency is necessary to reduce capacitance and lead length in order to increase the speed of performance of the device.

A measure of effective utility of an EPROM device is the density of the memory cells. Typically an EPROM device, when used in EPLD technology, will have its memory cells arranged in a two dimensional array which is bounded by its associated read and programmable circuits. To achieve higher density, many devices incorporate a plurality of arrays in a single semiconductor integrated circuit chip.

By these prior art designs using multiple arrays, some circuitry was duplicated. One solution, which is discussed infra, combines the read circuitry for the two arrays in the row divers. It is appreciated that a further reduction in the size of the associated circuitry will permit additional memory cells to be disposed in the pitch constrained area.

SUMMARY OF THE INVENTION

The present invention integrates the read and programming row driver circuits for EPLD devices. By combining the circuitry of the read and programming drivers, it is possible to reduce the physical size of the associated circuitry within a pitch constrained area of the device. The integrated read and programming driver is used to control row address access of the device which has a plurality of memory arrays.

The device of the present invention utilizes CMOS circuitry, wherein each word line is coupled as an output of a CMOS inverter. The gates of the output inverters are coupled together to a node. This node is also coupled to a junction of another CMOS inverter, which gate is controlled by a read signal during a read operation. The read signal controls the activation of this CMOS inverter, which then activates the corresponding transistors of the output inverters.

For programming a plurality of programming transistors are coupled in series to the node. The node is pulled up to a high state. When a selected row is to be addressed for programming, the address signals activate the plurality of programming transistors to conduct, pulling the node to a lower potential state.

BRIEF DESCRIPTION OF THE DRAWINGS

FIG. 1 is a block diagram of a prior art organization of a memory array, read driver, and program drivers.

FIG. 2 is a detailed block diagram showing a complete prior art device architecture which incorporates the architecture of FIG. 1.

FIG. 3 is a circuit schematic diagram of the prior art read driver and program driver.

FIG. 4 is a block diagram showing an organization of logic arrays and read/program driver of the present invention.

FIG. 5 is a detailed block diagram showing a complete device architecture and incorporating the architecture of FIG. 4.

FIG. 6 is a circuit schematic diagram of the read/program driver of the preferred embodiment.

DETAILED DESCRIPTION OF THE PRESENT INVENTION

The present invention describes an integrated read and programming driver architecture and circuit for use in an EPLD. In the following description, numerous specific details are set forth in order to present a thorough understanding of the invention. It will be obvious, however, to one skilled in the art that the present invention may be practiced without specific details. In other instances well known methods and structures have not been described so as not to unnecessarily obscure the present invention.

In order to understand the present invention, it will be helpful to describe in detail the prior art. The present invention develops on this prior art device, but improvements, advantages and distinguishable differences are shown.

Prior Art

FIG. 1 shows a block diagram of a typical prior art configuration of row drivers and logic arrays. Two memory arrays 13 are shown separated by a read driver 12. Each memory array 13 is typically configured as a two dimensional matrixed array wherein memory cells are arranged in columns and rows. The structure and function of these arrays 13 are well known in the prior art. The read driver 12 is disposed to access the rows of arrays 13 during the read operation of the memory 13. A single read row driver 12 is utilized to access the rows of both arrays 13. During the programming of the arrays 13 a programming device alone is used to provide signals to the rows of an array 13 for programming the appropriate memory cell of array 13. A separate programming driver 11 is used with each array 13 in the prior art.

As stated in the background, a problem in designing an EPLD lies with the pitch constrained area. The circuit of FIG. 1 combines the row drivers which perform the accessing operation during the read cycle.

FIG. 2 is a more detailed diagram of the device of FIG. 1. The row driver 12 borders two memory arrays 13. Each memory array 13 is also bordered by column decoder 16, architecture circuit 17, and macrocells 19. Four macrocells 0-3 process outputs from the upper array 13 and four macrocells 4-7 process outputs from the bottom array 13. An address signal for accessing array 13 is coupled as an input to input circuit 14 which is then coupled to an address decoder 15 as well as to read driver 12. Address decoder 15 is coupled to programming row drivers 11 and column decoders 16. The address decoder 15 decodes input address signals to provide row and column information for accessing and programming array 13. Programming circuits 11 are coupled to function with its corresponding column decoder 16 during a programming cycle.

Outputs from array 13 are coupled to appropriate macrocells 19 and processed according to circuitry of macrocell 19. In some instances, one or more of the macrocells 19 will provide a feedback signal to array 13 for functioning as a sequential logic circuit.

One embodiment of a prior art circuit is shown in FIG. 3, which is a circuit diagram of a read driver 61 and programming driver 62 which are equivalent to the read and programming portion of the drivers 12 and 11 of FIG. 1, respectively. This circuit is implemented using complementary metaloxide-semiconductor (CMOS) technology. Driver 61 is used to read from an EPROM array 72 over word line 36. The programming driver 62 is used to program the EPROM array 72. The array 72 is coupled to both the read 61 and program 62 drivers by word line 36. When two memory arrays are used, a second set of EPROM array 72 and programming driver 62 would be coupled to read driver 61. A plurality of these drivers 61 and 62 will be required, one for each row of the arrays and each one activated by a corresponding row address signal.

The read driver 61 is comprised of transistors 101, 102, 103, and 104 coupled in series betweeen VPI and VSS. A gate of transistor 104 is coupled to driver enable signal ENA and the gate of transistor 101 is coupled to be driven by the complement of signal ENA. A READ signal is coupled to the gate of transistors 102 and 103. In this particular prior art circuit, transistors 101 and 102 are p-channel transistors and transistors 103 and 104 are n-channel transistors. Word line 36 is coupled to the drains of transistors 102 and 103. VSS is ground in this instance.

The programming driver 62 has two program enable signals, PGMEN1 and PGMEN2. PGMEN1 is coupled to the gates 109 and 111. Transistors 109 and 111 are coupled in series between VPI and VSS to operate as a CMOS driver, transistor 109 being p-channel and 111 being n-channel. Transistors 106, 107, and 108 are coupled in series between VPI and ground. Transistor 106 is a p-channel device and transistors 107 and 108 are n-channel devices. PGMEN2 is coupled to the gate of transistor 107 and word line 36 is coupled to the drains of transistors 106 and 107. The gates of transistors 106 and 108 are coupled together to the junction of the drain of transistors 109 and 111. A plurality of row addressing lines (RAx) are each coupled to the gates of its respective transistor 110. Although only one address line can be used to access a particular row, multiple transistors are used in many prior art devices to provide a more selective control during programming cycles. All transistors are coupled in series between VSS and the junction of drains of transistors 109 and 111. Transistors 110 are all n-channel transistors. When this particular row of the array 72 is to be selected all RAx lines must be high causing a low to be placed on the gate of transistor 106 and causing transistor 106 to conduct. This causes VPI to be placed on word line 36. When this particular row is not selected, at least one of the RAx lines will be low causing transistor 108 to conduct, which places a low on word line 36.

During a read mode, signal states are as follows:
PGMEN1 = 0(LOW)
PGMEN2 = 0(LOW)
READ = 1 or 0
ENA = 1
VPI = VCC (typically +5V)

The read input wil be alternatively one or zero depending on the current input stage to the device, and is inverted by the inverter formed by transistors 101–104, during word line 36 either high or low by the read driver 61.

To program the EPROM, the following signal states are used:
PGMEN 1 = 0
PGMEN 2 = 1
READ = X(Tri-stated High Z)
ENA = 0
VPI = VPP (Typically +12V)

With this signal arrangement, transistor 108 conducts placing a low on word line 36. However, when RAx lines cause all transistors 110 to conduct, then transistor 108 is cut off and transistor 106 conducts placing VP1 on word line 36.

Present Invention

FIG. 4 shows the architecture of the present invention in which an integrated read and programming driver 21 is disposed to provide read and programming of memory array 22. Memory array 22 is equivalent to the EPROM array 13 of FIG. 1, but is not limited to such. This configuration is an improvement over the prior art circuit of FIG. 1 in that the programming and read drivers are combined to form a single read and programming driver 21 to operate with both arrays 22. This reduces the size of the circuitry utilized with memory arrays 22. By lessening the amount of read and programming circuitry needed in the constrained area, additional EPROM cells can be added and density increased. Another consideration in the design of EPLD devices is the speed performance of the read and programming drivers. Generally only the speed of the read circuitry is of concern, because programming is an infrequent event. However, a read operation should be achieved relatively quickly because these devices are typically used in the read mode. The following description of the present invention will show that the speed of providing the reading function in the present invention is at least as fast as the prior art, but with the added advantage of achieving an increase in overall circuit density.

A more complete drawing of the EPLD of the present invention is shown in FIG. 5. FIG. 5 shows a read and programming row driver 21 disposed between two memory arrays 22. An address signal is coupled as an input to input circuit 14a and coupled to decoder 15a. The input circuit 14a is also coupled to read portion of driver 21. Decoder 15a receives an input signal and provides a row and column address. Decoder 15a is coupled to row driver 21 to deliver decoded address to programming portion of driver 21. Similarly decoder 15a is coupled to column decoder 16a to provide a column address. The row address selects the row location and the column address selects the column location to access a cell of a matrixed array 22. The output of the arrays are coupled to macrocells 19a. The operation of the circuits 14a, 15a, 16a, 17a, and 19a are equivalent to those of the same reference number of FIG. 2 but without the suffix "a". The programming drivers 11 for each of the arrays 13 of FIG. 1 and 2 have been replaced with a single programming driver in the present invention. Further, it is to be appreciated that various other addressing and decoding scheme can be used to practice the present invention.

A portion of the integrated read and programming row driver 21 of the present invention is shown in FIG. 6. The driver circuit 60 of FIG. 6 is replicated for each row of the memory array 22. Driver 60 resides within the pitch constrained area and also utilizes CMOS technology. From each driver 60, two word lines 45 and 46 are each coupled to its respective memory array as output of its respective CMOS inverters formed by transistors 50 and 51. Both transistors 50 (50a and 50b) are p-channel transistors and transistors 51 (51a and 51b) are n-channel transistors. Each set of transistors 50 and 51 are coupled in series between VPI and VSS, which in this instance is ground.

A p-channel transistor 51 and n-channel transistor 56 are coupled in series between VPIx and VSS to form a CMOS inverter, such that node 44 is coupled to the drains of transistors 52 and 56. A plurality of n-channel transistors 58 are coupled in series between node 44 and ground such that transistors 58 are in parallel with transistor 56. Gates of transistors 58 are each coupled to addressing row lines, such that when this particular row is addressed, all transistors 58 conduct, causing a low (ground) to be placed on node 44. The gates of transistors 52 and 56 are coupled to receive a read input signal RI.

Functionally, $X_1$-$X_m$ are row address lines which can be received from decoder 15a of FIG. 5 or from other associated programming circuitry. It is to be appreciated that these lines can also be derived directly from the address bus. In the preferred embodiment, the $X_i$ inputs are from decoder 15a. As provided in the preferred embodiment, the portion of the driver 60 shown within the dotted line resides within the pitch constrained area of the device which includes the $X_1$ transistor. A number of transistors 58 reside outside of the pitch constrained area typically with its associated circuitry. During a read operation, at least one of the $X_i$ inputs is set to 0 to deactivate the programming leg of transistors 58, so that the state of the read input RI activates either transistor 52 or 56, causing transistors 51 or 50 to conduct, respectively. VPI equals VCC during read mode.

To program, RI is set to activate transistor 52 and thereby placing VPIX onto node 44. When this particular row is to be programmed, $X_1$-$X_m$ is set high causing all transistors 58 for this row to turn on. This then causes node 44 to drop in potential. Transistors 52 and 58 act in a ratio fashion which can take a longer period of time to activate transistors 50. This is because node 44 must come very close to ground for transistors to turn on and place VPI on word lines 45 and 46. VPI equals VPP in the program mode. Although the programming cycle may take a slightly longer period of time than the prior art circuit of FIG. 3, the read cycle timing is not affected. However, as can be noted, the physical size of the read and programming circuitry in the pitch constrained area has been reduced significantly.

It is to be appreciated that once the row has been selected, the column signals select the desired memory cell from the row selected. Further, this programming sequence described can also be used during the verify cycles wherein during verify cycles reprogramming of memory cells may be required, such techniques during verifying cycles being well known in the prior art.

Thus, an improved EPLD device which combines read and programming drivers for controlling row access of a plurality of memory arrays is described.

We claim:

1. In an integrated circuit having a programmable memory array, a read and programming driver comprising:
   an output driver coupled to drive a word line of said memory arrays, said output driver coupled to a node such that a potential on said node controls operation of said output driver;
   a first transistors coupled between said node and a power source;
   a second transistor coupled between said node and a return of said power source;
   one of said first and second transistors being activated by a read control signal coupled to its gate during a read operation;
   a plurality of programming transistors coupled in series between said node and said power return such that said programming transistors are activated by programming control signals coupled to the gates of said programming transistors, said first transistor being activated during programming to operate with said programming transistors to control output from said output driver.

2. The driver defined in claim 1 wherein said output driver is comprised of a CMOS inverter transistor pair.

3. The driver defined in claim 2 further including a second CMOS inverter transistor pair coupled to said node.

4. The driver defined in claim 3 wherein said first and second transistors are disposed to form a CMOS inverter pair such that each of said first and second transistors has its gate coupled to said read control signal.

5. The driver defined in claim 4 wherein said programming transistors are configured such that only one lies in a pitch constrained area of said EPROM array.

6. In an integrated circuit having a plurality of electrically programmable read only memory (EPROM) arrays, each arranged in a row and column matrixed array and accessed by row and column address signals coupled to said arrays, a read and programming driver circuit comprising:
   an output driver coupled to drive a word line of said memory array, said output driver coupled to a node such that a potential on said node controls operation of said output driver;
   a first transistor coupled between said node and a power source;
   a second transistor coupled between said node and a return of said power source;
   one of said first and second transistors being activated by a read control signal coupled to its gate during a read operation;
   a plurality of programming transistors coupled in series between said node and said power return such that said programming transistors are activated by programming control signals coupled to the gates of said programming transistors, said first transistor being activated during programming to operate with said programming transistors to control output from said output driver.

7. The driver circuit defined in claim 6 wherein said output driver is comprised of a CMOS inverter transistor pair.

8. The driver circuit defined in claim 7 further including a second CMOS inverter transistor pair coupled to said node.

9. The driver circuit defined in claim 8 wherein said first and second transistors are disposed to form a CMOS inverter pair such that each of said and second transistors has its gate coupled to said read control signal.

10. The driver circuit defined in claim 9 wherein said programming transistors are configured such that only one lies in a pitch constrained area of said EPROM array.

11. In an erasable programmable logic device having at least one memory array, a read and programmable driver for driving a corresponding word line of each array, comprising:
a plurality of output inverters each coupled to provide an output to drive its corresponding word line and each being driven by a potential on a node coupled to each said output inverter such that the potential of said node controls said first output inverter;
a first transistor coupled between a power source and said node;
a second transistor coupled between a power return and said node;
said first and second transistors having their gates coupled to accept a read enable signal during a read cycle; causing one of said first and second transistors to control said potential on said node for driving said output inverters;
a plurality of programming transistors, coupled in series between said node and said return, each of said programming transistors having its gate coupled to a selective programming signal, such that upon activation of all of said programming signals said plurality of programming transistors are caused to conduct during a programming cycle;
said output inverters providing a first output potential and its return during said read cycle and a second output potential and its return during said programming cycle.

12. In a CMOS erasably programmable logic device having two memory arrays, a read and programming driver for driving a corresponding word line of each array, comprising:
a first output inverter having two transistors, a first p-channel transistor having its souce coupled to a first power source, its drain coupled to a first word line, and its gate coupled to a node; and a first n-channel transistor having its source coupled to a power return, its drain coupled to said first word line, and its gate coupled to said node, such that a potential on said node controls said first output inverter;
a second output inverter having two transistors, a second p-channel transistor having its source coupled to said first power source, its drain coupled to a second word line, and its gate coupled to said node, and a second nchannel transistor having its source coupled to said power return, its drain coupled to said second word line, and its gate coupled to said node, such that said potential said node controls said second output inverter;
a third p-channel transistor having its source coupled to a second power source, its drain coupled to said node, and its gate coupled to a read signal;
a third n-channel transistor having its source coupled to said power return, its drain coupled to said node, and its gate coupled to said read signal; such that said read signal activates one of said third n-channel and p-channel transistors to control said potential on said node duriing a read cycle;
a plurality of n-channel programming transistors coupled in series between said node and said return and being in parallel to said third n-channel transistor, wherein durig a programming cycle said third p-channel transistor is activated and said third n-channel transistor is deactivated, such that said programming transistors control said potential on said node.

* * * * *

UNITED STATES PATENT AND TRADEMARK OFFICE
CERTIFICATE OF CORRECTION

PATENT NO. : 4,875,191

DATED : 10/17/89

INVENTOR(S) : Mulder et al.

It is certified that error in the above-identified patent and that said Letters Patent is hereby corrected as shown below:

| | | |
|---|---|---|
| col. 08, line 20 | delete "nchannel" | insert --n-channel-- |
| col. 08, line 34 | delete "duriing" | insert --during-- |
| col. 08, line 37 | delete "durig" | insert --during-- |

Signed and Sealed this

Fifth Day of March, 1991

*Attest:*

HARRY F. MANBECK, JR.

*Attesting Officer*      *Commissioner of Patents and Trademarks*